United States Patent [19]

Nakajima et al.

[11] Patent Number: 5,412,496
[45] Date of Patent: May 2, 1995

[54] TRANSMITTER/RECEIVER FOR FREQUENCY-MODULATED OPTICAL SIGNALS AND OPTICAL LINK CORRESPONDING THERETO

[75] Inventors: Hisao Nakajima, Bagneux; Radhouane Derouiche, Paris, both of France

[73] Assignee: France Telecom Etablissement Autonome de Droit Public, Paris, France

[21] Appl. No.: 5,056

[22] Filed: Jan. 15, 1993

[30] Foreign Application Priority Data

Jan. 24, 1992 [FR] France .................. 92 00753

[51] Int. Cl.⁶ .............................................. H04B 10/00
[52] U.S. Cl. .................................... 359/152; 359/182; 372/45; 372/96
[58] Field of Search ............... 359/152, 154, 163, 173, 359/188, 195, 183, 182; 372/96, 45, 46

[56] References Cited

U.S. PATENT DOCUMENTS

| | | | |
|---|---|---|---|
| 4,743,087 | 5/1988 | Utaka et al. | 372/96 |
| 4,894,834 | 1/1990 | Kakimoto et al. | 372/44 |
| 4,972,514 | 11/1990 | Linke | 359/170 |
| 5,119,393 | 6/1992 | Oka et al. | 372/96 |
| 5,170,402 | 12/1992 | Ogita et al. | 372/96 |
| 5,177,758 | 1/1993 | Oka et al. | 372/96 |
| 5,185,759 | 2/1993 | Matsuyama | 372/96 |
| 5,253,309 | 10/1993 | Nazarathy et al. | 385/4 |
| 5,272,714 | 12/1993 | Chen et al. | 372/96 |

FOREIGN PATENT DOCUMENTS

| | | |
|---|---|---|
| 0420742 | 4/1991 | European Pat. Off. . |
| 2662883 | 12/1991 | France .................. 359/152 |
| 2229880 | 10/1990 | United Kingdom . |

OTHER PUBLICATIONS

Journal de Physique, vol. 49, Sep. 1988, pp. C4-337-C-4-339, M. Gilleron, et al., "1.5 $\mu$m Phase Shifted Distributed Feeback Laser".
Patent Abstracts of Japan, vol. 10, No. 209, (E-421)(2265), Jul. 22, 1986, JP-A-61 50 386, Mar. 3, 1986.
Patent Abstracts of Japan, vol. 13, No. 476(E-837), Jul. 27, 1989, JP-A-11 87 889.

*Primary Examiner*—David K. Moore
*Assistant Examiner*—Rafael Bacares
*Attorney, Agent, or Firm*—Oblon, Spivak, McClelland, Maier & Neustadt

[57] ABSTRACT

A transmitter/receiver including a stack of semiconductor layers with an active layer 12 and a diffraction grating 16 with a phase shifter 18. A tapping electrode 30 is formed above the phase shifter in order to tap a voltage whose variations reflect the frequency modulation of a light beam propagating in the active layer. A bi-directional optical link is formed by connecting multiple transmitter/receivers according to the invention together via optical communication lines. The present invention finds particular application in the field of optical telecommunications.

6 Claims, 4 Drawing Sheets

$dF = Fi - Fo$

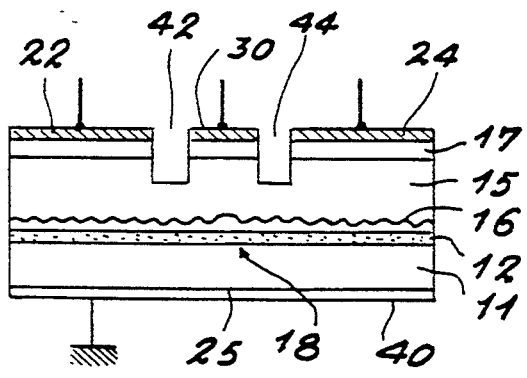
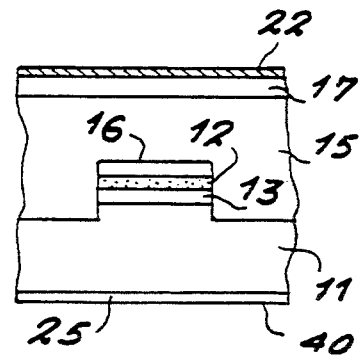
FIG. 6A  FIG. 6B
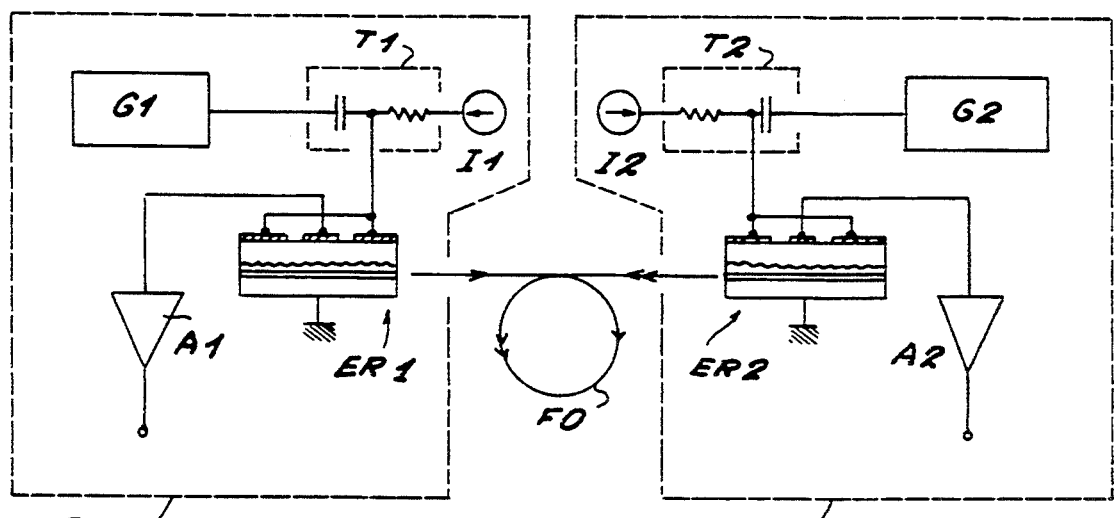
FIG. 7
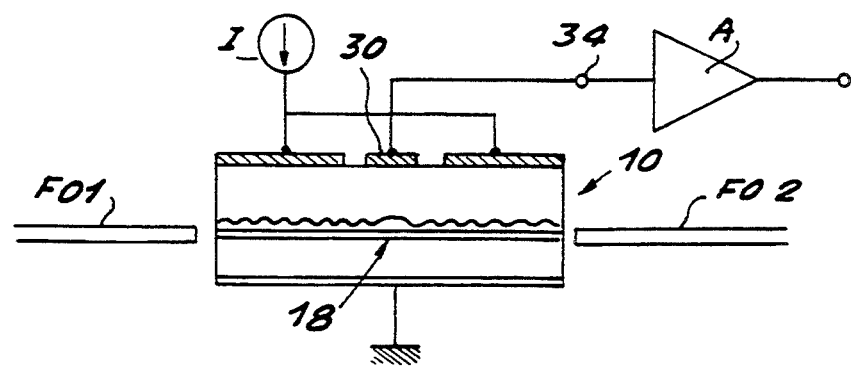
FIG. 8

TRANSMITTER/RECEIVER FOR FREQUENCY-MODULATED OPTICAL SIGNALS AND OPTICAL LINK CORRESPONDING THERETO

TECHNICAL FIELD

The present invention relates to a photoreceiver for frequency-modulated optical signals, to a corresponding transmiter-receiver and to a bidirectional optical link using such a transmitter-receiver.

The invention has general applications in optical telecommunications.

PRIOR ART

In the field of optical telecommunications, for some years now use has been made of semiconductor devices, which are particularly advantageous because they have both a transmitter and a receiver. Such devices are more particularly described in the following articles:

A. Alping, B. Bentland and S. T. Eng, "100 Mb/s laser diode terminal with optical gain for fibre-optic local area networks", Electron. Lett., 20, pp. 794–795, 1984, N. A. Olsson and L. L. Buhl, "Single-laser high-selectivity bidirectional transmission system for local-area-network applications", Electron. Lett., 23, pp. 62–64, 1987.

L. d'Auria, G. Chevalier and P. Maillot, "LIBIDO using EROS half-duplex optical kink", Electron. Lett., 15, pp. 820–821, 1979.

P. A. Andrekson and N. A. Olsson, "Optical full-duplex transmission with diode laser amplifiers", J. Lightwave Tech., 9, pp. 737–740, 1991.

Optical links operating in frequency modulation (FM) or frequency shift keying (FSK) have been produced with a semiconductor laser operating as a transmitter and as a receiver. Such links are e.g. descrubed in the following documents:

T. L. Koch, F. S. Choa, F. Heisman and U. Koren, "Tunable multiple-quantum-well distributed-Bragg-reflector laser as tunable narrowband receivers", Electron. Lett., 25, pp. 890–892, 1989.

M. J. Chawki, R. Auffret and L. Berthou, "1.5 Gb/s FSK transmission system using two electrode DFB laser as tunable FSK discriminator/photodetector", Electron. Lett., 26, pp. 1146–1148, 1990.

H. Nakajima, "Demodulation of multi-gigahertz frequency-modulated optical signals in an injection-locked distributed feedback laser oscillator", Electron. Lett., 26, pp. 1129–1130, 1990.

FR-A-2 652 465.

In this known procedure, the semiconductor structure is generally a distributed feedback (DFB)structure. Two types of operation can occur depending on whether the structure is functioning as an amplifier (i.e. when it is polarized below the threshold) or as an oscillator (when it is polarized well above the threshold).

In all cases, voltage is tapped at the terminals of the semiconductor structure, the variations of said voltage reflecting the frequency variations. Thus, by the bias of said voltage, it is possible to carry out a demodulation restoring the original information used for modulating the optical beam (in FM or FSK).

The final document cited, namely FR-A-2 652 465, describes the differences between the two operating modes (amplifier/oscillator) and inter alia shows the interest of structures operating as an oscillator.

Although satisfactory in certain respects, said devices suffer from the disadvantage of only having a limited sensitivity in frequency-voltage conversion. In amplifier operation, the conversion sensitivity is approximately 0.6 mV/GHz. In oscillator operation, it is even lower and drops to 0.2 mV/GHz. This limited sensitivity limits the transmission rate.

The present invention aims at obviating this disadvantage by proposing a structure leading to a better efficiency. According to the invention, the sensitivity passes to approximately 1.2 mV/GHz, i.e. double the efficiency of the best prior art means. This improvement applies both in amplifier and oscillator operations.

DESCRIPTION OF THE INVENTION

The invention proposes the use of a distributed feedback (DFB) structure, but in the case where said structure comprises an optical phase shift zone in the grating. It is known that such a zone, sometimes called a phase shifter, makes it possible to eliminate a wavelength degeneration disturbing the operation of the laser, in the sense that it makes it possible to oscillate on two different wavelenths. As a result of the introduction of a phase shifter, a single wavelength becomes possible. The invention makes use of this improvement and proposes placing an electrode reserved for voltage tapping above the phase shifter, the supply or feed electrode of the structure being retained, but is subdivided into two half-electrodes positioned on either side of the tapping electrode.

Thus, more specifically, the present invention relates to a photoreceiver for frequency-modulated optical signals, comprising a distributed feedback (DFB) semiconductor structure constituted by a stack of layers, including an active layer and a diffraction grating optically coupled to at least part of said active layer, said grating having a central region introducing an optical phase shift, said structure being covered by an electrode connected to a power supply, said photoreceiver also comprising means for tapping the voltage at the terminals of the structure, said photoreceiver being characterized in that the means for tapping the voltage at the terminals of the structure are constituted by a center electrode positioned above the central region of the grating introducing an optical phase shift, the supply electrode then being subdivided into two lateral half-electrodes positioned on either side of the centre electrode and electrically insulated therefrom.

The present invention also relates to a transmitter-receiver constituted by the photoreceiver defined hereinbefore and which is also used as the laser source.

It should be observed that the component according to the invention operates in the locking zone, i.e. the emitted radiation is frequency locked on the received radiation.

Finally, the invention relates to a bidirectional optical link comprising two transmitter-receiver assemblies constituted by the aforementioned transmitter-receiver, which still operates in the locking zone.

BRIEF DESCRIPTION OF THE DRAWINGS

FIG. 6 shows a detail of the stack of layers.

FIG. 7 illustrates a bidirectional link using a transmitter-receiver according to the invention.

FIG. 8 shows an application of the invention to the construction of a repeater.

DETAILED DESCRIPTION OF THE EMBODIMENTS

Figure 1:
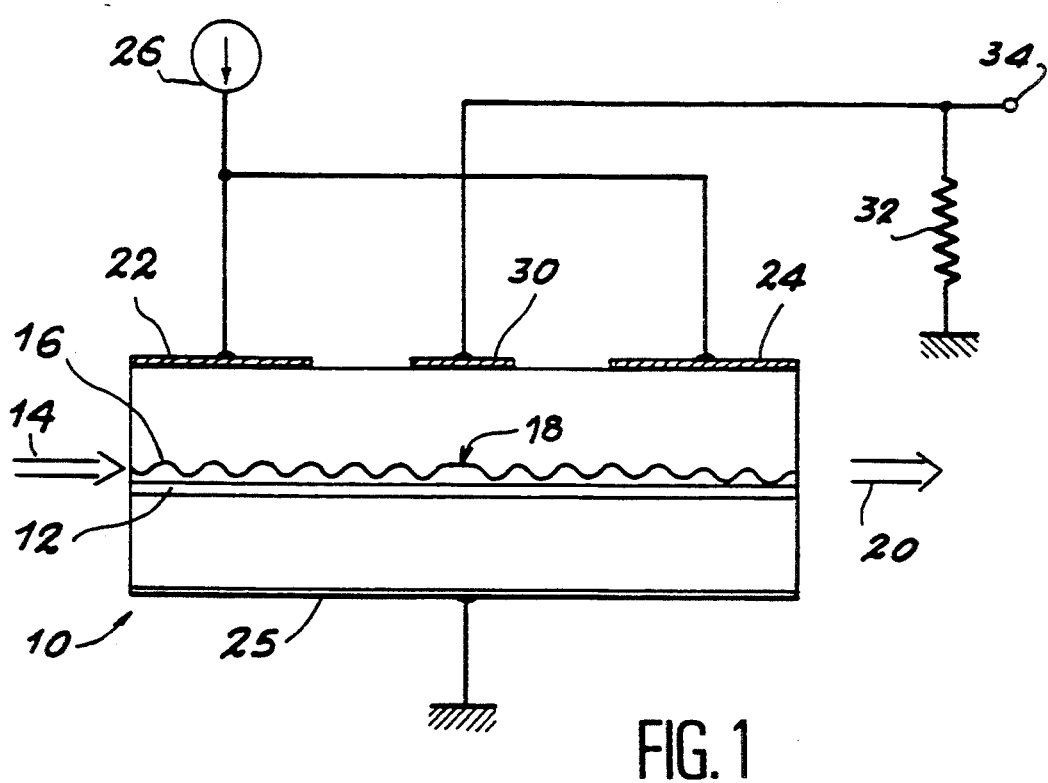
FIG. 1 illustrates a photoreceiver according to the invention.

The photoreceiver shown in FIG. 1 comprises a distributed feedback (DFB) semiconductor structure 10 constituted by a stack of layers, including an active layer 12 receiving an optical beam 14 and a diffraction grating 16 optically coupled to at least part of the active layer 12. This grating 16 has a central region 18 introducing an optical phase shift.

The means for tapping voltage at the terminals of said structure are constituted by a center electrode 30 positioned above the central region 18 of the grating introducing an optical phase shift. The supply electrode is then subdivided into two lateral half-electrodes 22, 24 positioned on either side of the center electrode 30 and electrically insulated therefrom. An electrode 25 is also placed beneath the structure and is e.g. connected to earth or ground. The tapping electrode 30 is connected to a resistor 32. The output element 34 constitutes the photoreceiver output.

The semiconductor structure is supplied with current by the two half-electrodes 22, 24, which are connected in parallel to a power supply 26. However, it would also be possible to separately supply these two electrodes.

Figure 2:
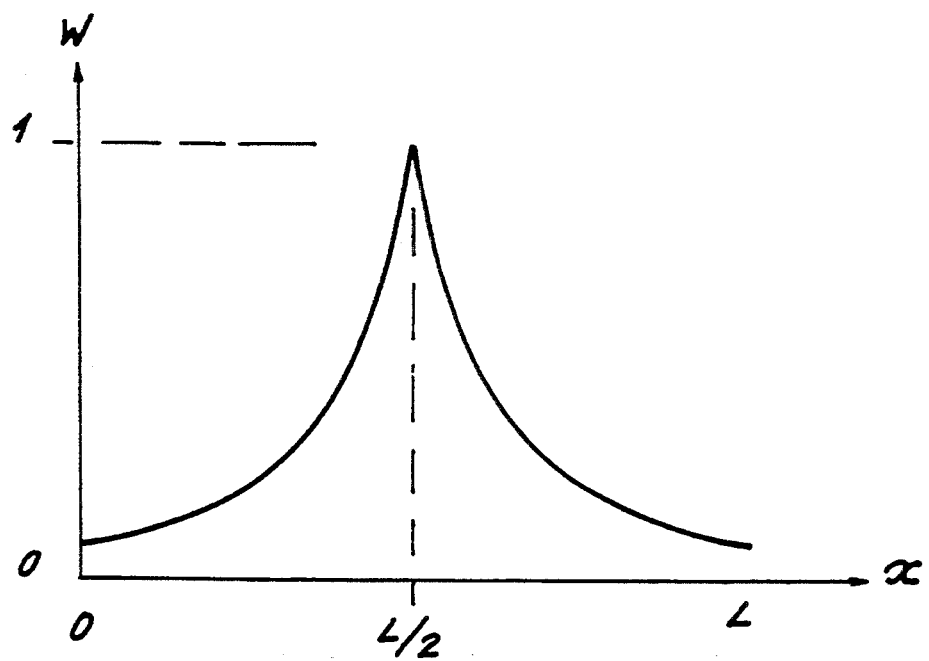
FIG. 2 shows the optical power variations along the active layer.

In a DFB laser with phase shift, the optical power tends to be concentrated in the center of the structure, as illustrated in FIG. 2, where it is possible to see the optical power W (in arbitrary units) as a function of the distance x along the active layer. The laser cavity is assumed to have a length L. A very marked maximum occurs in the central area of abscissa L/2.

FIG. 2 corresponds to a coefficient KL of approximately 4, in which K is the coupling coefficient of the grating with the active layer and L the laser cavity length.

Figure 3A:
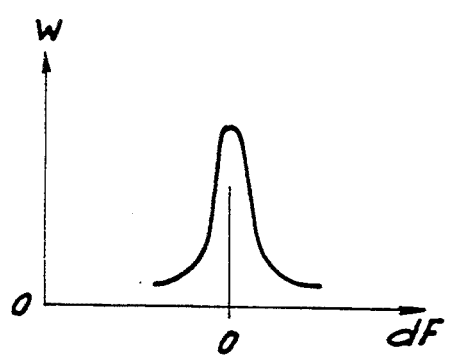
FIG. 3 illustrates the demodulation principle in the case of amplifier operation.
Figure 3B:
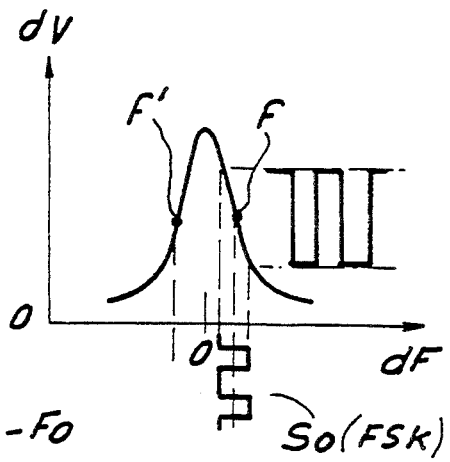
Figure 4A:
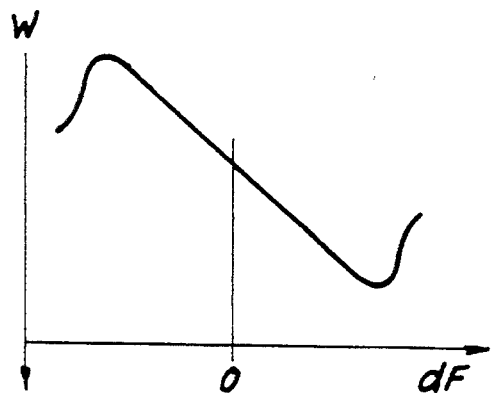
FIG. 4 illustrates the demodulation principle in the case of oscillator operation.
Figure 4B:
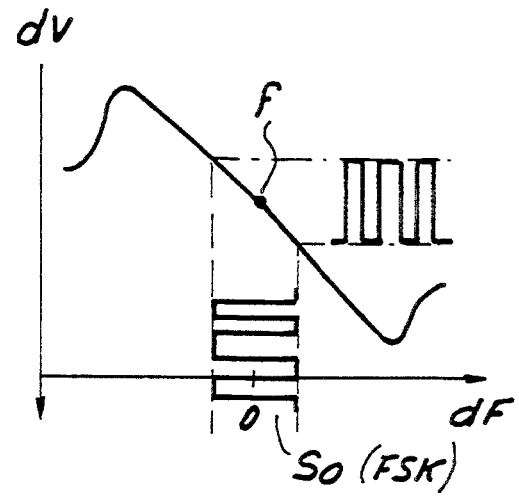

FIGS. 3 and 4 illustrate the operation of the photoreceiver according to the invention respectively under amplifier and oscillator operating conditions. FIGS. 3(a) and 4(a) shows the optical power variation in the semiconductor structure as a function of the frequency swing dF between the frequency of the incident optical beam and the natural frequency of the semiconductor structure. FIGS. 3(b) and 4(b) shows the voltage variation dV tapped on the centre electrode 30, when a FSK-modulated optical signal is introduced into the active layer. This optical signal SO(FSK) is assumed to have a sequence of two discrete frequencies about a mean frequency. This mean frequency corresponds to a frequency shift dF either on one of the substantially linear slopes of the curve dV(dF) for an amplifier operation, or a zero frequency shift for an oscillator operation. This operating point is designated f in FIG. 4b and f and f' in FIG. 3b.

The operating differences between the amplifier and oscillator modes with an error curve for the amplifier mode and a Z layer for the oscillator mode have already been stressed in FR-A-2 652 465, to which reference can be made for further details.

It will be observed that in the present invention, the frequency difference Fi-Fo between the frequency of the incident radiation and the natural frequency of the laser is below the bandwidth in which locking occurs.

Therefore one of the essential characteristics of the invention is the presence above the phase shifter of a voltage tapping electrode. This phase shifter can be of a known type. Numerous embodiments have been described in the literature and in particular in the following articles:

K. Sekartedjo, N. Eda, K. Furuya, Y. Suematsu, F. Koyama and T. Tanbun-Ek, "1.5 μm phase-shifted DFB lasers for single-mode operation", Electron. Lett., 20, pp.80–81, 1984.

M. Gilleron, J. Charil, D. Lesterlin, P. Correc and J. C. Bouley, "1.4 μm phase-shifted distributed feedback laser", J. Physique, Conference C4, Supplement to no.9, vol.49, Sep., 1988.

T. Matsuyama, A. Makuta, A. Tanaka, K. Ohtsuka, H. Agatsuma and J. Kinoshita, "TM mode suppression property of DFB lasers with a narrow stripe region", IEEE Photonics Techn. Lett. 2, pp.612–613, 1990.

Three examples of phase shifters are illustrated in FIG. 5, but it is obvious that these examples in no way limit the scope of the invention.

Figure 5A:
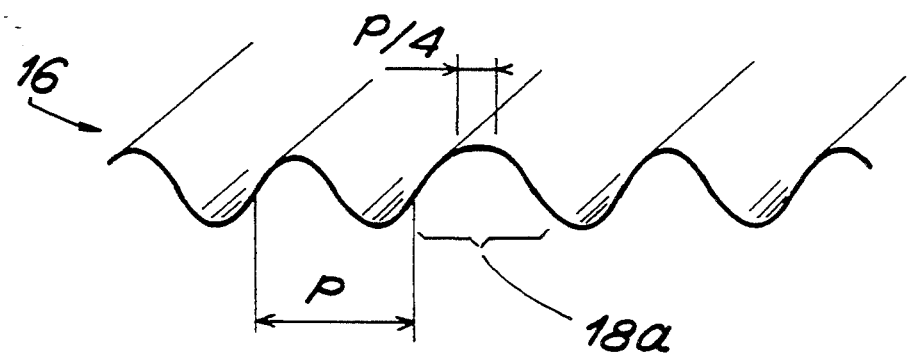
FIG. 5 shows exemplified embodiments of a phase shifter.

FIG. 5(a) diagrammatically shows a diffraction grating 16 with its surface having a periodic undulation of pitch or spacing p. In the central area 18a, said spacing is lengthened by a quarter spacing (p/4), which introduces an optical phase shift of a quarter wavelength for a wave passing along the grating in one or other direction. It would naturally also be possible to shorten the grating by a quarter of a spacing.

Figure 5B:
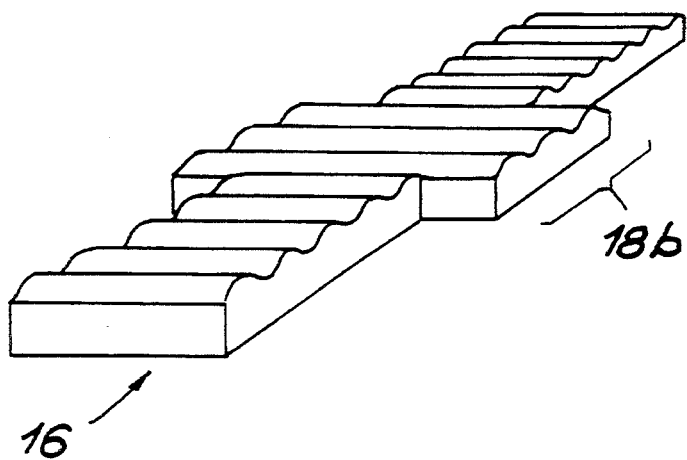

In FIG. 5(b) it is possible to see a grating 16 with a regular pitch or spacing, but which has a widened portion in the central area 18b. The length of the widened area corresponds to an optical phase shift of a quarter wavelength.

Figure 5C:
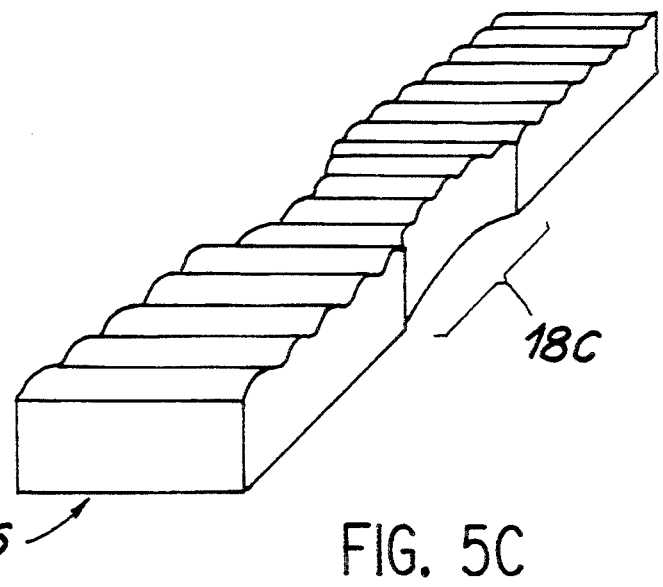

However, in FIG. 5(c) the grating has a narrowed area 18c.

All these phase shifters can be used in the invention.

Any process can be used for obtaining the structure according to the invention. For example, it is possible to use the Buried Ridge Stripe method, which is described in the article by J. Charil, S. Slempkes, D. Robein, C. Kazmierski and J. C. Bouley, "Extremely low threshold operation of 1.5 μm GaInAsP/InP buried ridge stripe lasers", Electron. Lett., 25, pp.1477–1479, 1989.

This embodiment, which is in no way limitative of the invention, is illustrated in FIG. 6, in longitudinal section (a) and in cross section (b). It is possible to see the elements already shown in FIG. 1 and which carry the same references, namely the active layer 12, the grating 16, the lateral electrodes 22, 24, the lower electrode 25 and the center electrode 30. It is also possible to see that the electrodes 22, 24 on the one hand and 30 on the other are separated by two breaks 42, 44 obtained by etching. It is also possible to see in part (b) that the active layer 12 is located in a buried ridge stripe in a layer 15. The active layer 12 can rest on a confinement layer 13, which in turn rests on a substrate 11. Finally, a highly doped semiconductor layer 17 is placed between the upper electrodes 22, 24, 30 and the layer 15.

In exemplified manner, the active layer 12 can be formed by means of a stack of layers constituting a multiple quantum well or MQW structure centred on the wavelenght of 1.5 μm. The substrate 11 can be of N-doped InP, the confinement layer 13 can be centred on a wavelength of 1.3 μm and the layer 15, everything being P-doped InP. The layer 17 can be of P+-doped InP.

The present invention also relates to a bidirectional optical link, which is shown in FIG. 7. It comprises a first subassembly Se1, an optical fibre FO and a second subassembly SE2. These two subassemblies are identical and incorporate the same means designated by a letter followed by a FIG. 1 for the first and a FIG. 2 for the second. The first subassembly SE1 thus comprises a transmitter-receiver ER1 like that of FIG. 1, a high frequency amplifier A1 connected to the centre, voltage tapping electrode, said amplifier supplying a demodulation signal, a power supply I1 connected to the lateral supply electrodes across a polarizing Tee T1 constituted by a capacitor and an inductance coil and finally an information generator G1 able to modulate the current of the laser in order to modulate its transmission frequency. The intensity of the current supplied by I1 is regulated in accordance with the selected operating mode, either in the vicinity of the threshold (amplifier), or well above the threshold (oscillator).

Finally, FIG. 8 shows that the structure according to the invention can operate as a repeater with the same means. In FIG. 8, the structure 10 receives a light beam from a first optical fibre FO1 and supplies an amplified beam guided by a second optical fibre FO2. As a result of its phase shift zone 18 and its voltage tapping electrode 30, the structure supplies a control voltage possibly amplifued by an amplifier A. It is thus possible to permanently control the quality of the amplified signal.

Obviously, numerous modifications and variations of the present invention are possible in light of the above teachings. It is therefore to be understood that within the scope of the appended claims, the invention may be practiced otherwise than as specifically described herein.

We claim:

1. A transmitter/receiver for frequency-modulated optical signals, comprising:
   a distributed feedback semiconductor structure having terminals and a stack of layers which includes an active layer and a diffraction grating optically coupled to at least a portion of said active layer, said diffraction grating having a central region which introduces an optical phase shift to received optical signals;
   a center electrode formed on said distributed feedback semiconductor structure and positioned above said central region of said diffraction grating for tapping a voltage at said terminals of said distributed feedback semiconductor structure, variations of said voltage reflecting a frequency modulation of said optical signals propagating within said active layer; and
   a pair of supply electrodes formed on said distributed feedback semiconductor structure positioned on either side of said central electrode and electrically insulated therefrom, each of said supply electrodes being connected to a power supply to receive current therefrom.

2. A transmitter/receiver according to claim 1, wherein said central region of said diffraction grating comprises an area where a spacing of said grating is locally decreased or increased.

3. A transmitter/receiver according to claim 1, wherein said central region of said diffraction grating comprises an area where a width of said grating is increased or decreased while a spacing thereof remains constant.

4. A transmitter/receiver according to claim 1, wherein said active layer comprises a solid or multiple quantum well semiconductor layer.

5. A transmitter/receiver for frequency-modulated optical signals, comprising:
   a distributed feedback semiconductor structure having terminals and a stack of layers which includes an active layer and a diffraction grating optically coupled to at least a portion of said active layer, said diffraction grating having a central region which introduces an optical phase shift to received optical signals;
   a central electrode formed on said distributed feedback semiconductor structure and positioned above said central region of said diffraction grating for tapping a voltage at said terminals of said distributed feedback semiconductor structure, variation of said voltage reflecting a frequency modulation of said optical signals propagating within said active layer; and
   a pair of supply electrodes formed on said distributed feedback semiconductor structure and positioned on either side of said central electrode and electrically insulated therefrom, each of said supply electrodes being connected to a power supply to receive current therefrom, wherein a difference between a frequency of a received optical signal and a natural frequency of said transmitter/receiver is maintained below a bandwidth corresponding to a frequency locking bandwidth of said transmitter/receiver.

6. A bi-directional optical link comprising first and second transmitter/receivers connected to an optical transmission line, each of said first and second transmitter/receivers comprising:
   a distributed feedback semiconductor structure having terminals and a stack of layers which includes an active layer and a diffraction grating optically coupled to at least a portion of said active layer, said diffraction grading having a central region which introduces an optical phase shift to received optical signals;
   a central electrode formed on said distributed feedback semiconductor structure and positioned above said central region of said diffraction grating for tapping a voltage at said terminals of said distributed feedback semiconductor structure, variations of said voltage reflecting a frequency modulation of said optical signals propagating within said active layer; and
   a pair of supply electrodes formed on said distributed feedback semiconductor structure and positioned on either side of said central electrode and electrically insulated therefrom, each of said supply electrodes being connected to a power supply for receiving current therefrom, wherein a difference between a frequency of a received optical signal and a natural frequency of said transmitter/receiver is maintained below a bandwidth corresponding to frequency locking bandwidth of said transmitter/receiver.

* * * * *